(12) United States Patent
Peacock

(10) Patent No.: US 6,919,826 B1
(45) Date of Patent: Jul. 19, 2005

(54) SYSTEMS AND METHODS FOR EFFICIENT AND COMPACT ENCODING

(75) Inventor: John K. Peacock, Menlo Park, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/741,120

(22) Filed: Dec. 19, 2003

(51) Int. Cl.[7] .................................................. H03M 7/34
(52) U.S. Cl. .......................................... 341/51; 341/107
(58) Field of Search ............................ 341/50, 107, 51, 341/65, 67, 106

(56) References Cited

U.S. PATENT DOCUMENTS 5,933,105 A * 8/1999 Cho ............................ 341/107
6,549,148 B2 * 4/2003 Satoh .......................... 341/51
2004/0013311 A1 * 1/2004 Hirao .......................... 382/240

* cited by examiner

Primary Examiner—Peguy JeanPierre
(74) Attorney, Agent, or Firm—Finnegan, Henderson, Farabow, Garrett & Dunner, L.L.P.

(57) ABSTRACT

Systems and methods consistent with embodiments of the present invention provide for efficient and compact encoding. In an exemplary method for associating a codeward with a symbol in a file, the frequency of occurrence of the symbols in the file is determined. Next, a threshold is determined. Explicit codewords are assigned to symbols with greater then the threshold. The remaining symbols are ordered in sequence and implicit codewords are assigned to all of remaining symbols. Finally, an encoding table associating the codeword for each symbol is generated.

19 Claims, 5 Drawing Sheets

SYSTEMS AND METHODS FOR EFFICIENT AND COMPACT ENCODING

BACKGROUND OF THE INVENTION

I. Field of the Invention

The present invention generally relates to encoding. More particularly, the invention relates to systems and methods for efficient and compact encoding for use with thin-client devices.

II. Background Information

Large-scale thin-client computing platforms can surpass ordinary personal computers and workstations in raw performance, reliability, and scalability, with low cost of ownership and maintenance. One example of a thin-client computing platform is the Sun Ray™ system, developed by Suns® Microsystems of Santa Clara, Calif., which allows users to access their work anywhere on a local area network (LAN). The Sun Ray™ system allows for freedom from ties to an individual desk or machine. The thin-client device; consisting of a client, monitor, keyboard, mouse, and optionally a built-in smart card reader, connects to a remote server that handles all of the actual computing. The thin-client device only needs enough memory and computing power to recognize keystrokes and mouse events and to display pixel data received from the server.

Many users wish to take advantage of the thin-client platform from a home environment. Often this extension of the platform means an extension into a low-bandwidth network. The transfer of pixel data, which represent screen displays, for example, over a low-bandwidth network, can be prohibitively, or at least frustratingly, slow. Thus, there is a need for a data encoding algorithm to efficiently compress the pixel data during transmission between the server and the thin-client device.

Huffman encoding is an entropy encoding algorithm used for lossless compression of files based on the frequency of occurrence of a symbol in the file that is being compressed. The Huffman algorithm is based on statistical encoding, which means that the probability of occurrence of a symbol in the symbol stream (or file) has a direct bearing on the length of its representation.

In general, the data to be compressed is of a string of symbols, usually stored in a file. With Huffman encoding, symbols that are likely to be frequent in the string of symbols (symbol stream) are represented by a short sequence of bits, and symbols that are likely to be rare in the symbol stream are represented by a longer sequences of bits. Huffman encoding uses a specific method for choosing the representations for each symbol, resulting in a prefix-free code, where no bit string of any symbol is a prefix of the bit string of any other symbol.

Huffman encoding achieves the theoretical minimum average code size when the frequencies of various input characters are powers of two. Huffman encoding works by creating a binary tree of symbols. For example, a Huffman encoding algorithm may be as follows: Start with as many trees as there are symbols; Until there is only a single tree remaining, find the two trees with the smallest total probability and combine them into a single tree with two branches, one branch representing one of the original trees and the second branch representing the second of the original trees. When combining the trees in the previous algorithm, the probability of the combined tree will be the combined probability of the two branches. In this fashion, trees are combined from lowest probability to highest probability into a single tree. In the encoding, for example, a "1" can represent following the left branch and a "0" can represent following the right branch. In a decoding operation, the output symbol corresponding to each encoded input is found by following the tree from the root to the leaf node corresponding to the symbol, taking the left branch when a "0" is received and taking the right branch when a "1" is received.

The computational complexity of the classical Huffman construction requires that the symbols first be sorted by their frequency counts. At each step in the encoding process, the new tree is re-inserted into the list of symbols with the combined count so that the ordering of the trees by frequency counts is maintained. The Huffman encoding tree is thereby computed, and then the length of the Huffman code for each symbol is noted, and the number of codes of each length is totaled.

As an example of a conventional Huffman encoding process, consider a symbol stream with the corresponding symbol frequencies shown in Table 1. A completed Huffman tree construction based on the symbol frequencies shown in Table 1 is depicted in FIG. 1. Of course, an algorithm may result in a different final tree (e.g., the symbol "c" may be switched with "a"or "f" in the tree). In accordance with the example of Table 1, symbols "a", "f", and "c" each have the lowest count (and therefore the lowest probability of occurrences) of one. Trees corresponding to "f", and "a" can then be combined into an "fa" tree. The "fa" tree, now having a combined occurrence of two, is then combined with "c" to form the "fac" tree with combined occurrence of three. The "fac" tree is then combined with "e" to form a "face" tree with combined occurrence of six. The "b" and "d" trees, now being the trees with the lowest occurrence, are then combined to form a "bd" tree. Finally, the "bd" tree is combined with the "face" tree to form the single tree shown in FIG. 1.

The codes for each of the symbols that result from the Huffman tree construction shown in Table 1 can then be read directly from the combined tree shown in FIG. 1 and are given in Table 2. This results in an encoding with the bit-counts shown in Table 3.

A unique Huffman encoding table for the example illustrated in Table 1 can be generated given only the counts for each bit and the input symbol list for each size. Using canonical Huffman encoding, as described above, Table 3 would be encoded for transmission with the following set of values, where the maximum bit count in this example is sixteen:

Bit counts: {0, 3, 1, 2, 0, 0, 0, 0, 0, 0, 0, 0, 0, 0, 0, 0}

Symbol list: {b, d, e, c, a, f}

A device receiving this encoding table can then reproduce a tree with the same code sizes for the symbols as is shown in FIG. 1, but generally with a different encoding, as shown in Table 4.

TABLE 1

| Symbol | Count |
|---|---|
| a | 1 |
| b | 4 |
| c | 1 |
| d | 5 |
| e | 3 |
| f | 1 |

TABLE 2

| Symbol | Code |
|---|---|
| a | 0110 |
| b | 10 |
| c | 010 |
| d | 11 |
| e | 00 |
| f | 0111 |

TABLE 3

| Bits | Counts | Symbols |
|---|---|---|
| 1 | 0 | |
| 2 | 3 | b, d, e |
| 3 | 1 | c |
| 4 | 2 | a, f |
| 5 | 0 | |

The symbol list shown in the encoding table formed by the bit counts and symbol list contains all of the symbols in the symbol stream being encoded, sorted in ascending order by the number of bits each symbol requires in the output encoding. A code or codeword is the binary representation of the symbol. An example of the canonical Huffman encoding algorithm for generating the output codeword, where the symbols are sorted as above in the symbol lists, can be illustrated with the following example implementation:

s[k]=the kth symbol in {b, d, e, c, a, f} the huffsize [sym]=number of bits needed for symbol sym huffcode [sym] be the codeword for symbol sym N be the total number of symbols

```
k = 0;
code = 0;
nbits = 0;
while (k < N) {
    sym = s[k];
    while (nbits < huffsize[k]) {
        code = code << 1;
        nbits = nbits + 1;
    }
    huffcode[sym] = code;
    code = code + 1;
    k = k + 1;
}
```

For the example set of symbols shown in Table 1 above, this example implementation produces the Huffman output codes shown in Table 4

TABLE 4

| k | huffsize[ ] | s[ ] | huffcode[ ] |
|---|---|---|---|
| 0 | 2 | b | 00 |
| 1 | 2 | d | 01 |
| 2 | 2 | e | 10 |
| 3 | 3 | c | 110 |
| 4 | 4 | a | 1110 |
| 5 | 4 | f | 1111 |

The disadvantages of the canonical Huffman encoding are particularly apparent when all of the input symbols have the same frequency, and the number of symbols is a power of two. In that case the output codewords would all be the same length as the input codewords, and so no compression of the input sequence would be achieved. It is necessary, however, to send the encoding table, which would contain the set of 16 bit counts, as well as the list of the entire set of symbols. In some cases the output of the compression can be larger than the input data string. For example, consider a data string with the frequency of occurrence of the symbols shown in Table 5. Performing a Huffman tree construction yields the counts shown in Table 6. Because each of the six symbols alone take three bits to represent and, as is shown in Table 5, there are fifteen symbols total in the symbol stream, if the symbol stream was transmitted uncoded the total input size is 3 bits×15 symbols=45 bits. The coded size of the encoded bit stream, computed from the bit-counts shown in Table 6, is:

$$a \quad b \quad c \quad d \quad e \quad f$$
$$1 \times 4 + 1 \times 4 + 6 \times 1 + 5 \times 2 + 1 \times 4 + 1 \times 4 = 32 \text{ bits}$$

TABLE 5

| Symbol | Count |
|---|---|
| a | 1 |
| b | 1 |
| c | 6 |
| d | 5 |
| e | 1 |
| f | 1 |

TABLE 6

| Bits | Counts | Symbol |
|---|---|---|
| 1 | 1 | c |
| 2 | 1 | d |
| 3 | 0 | |
| 4 | 4 | a, b, e, f |

However, since each symbol takes 3 bits to represent, Table 6 contains a list that, requires 6×3=18 bits to represent. Therefore, the total size of the encoded file, neglecting the bit counts, is at least 32+18=50 bits. The encoding for any symbol that only appears once in the input stream adds bits to the output, because the code has to appear once in the table.

Thus, there is a need for encoding of the symbols and the table that is smaller than the original symbol sequence, while providing efficient compression of the symbol stream. Accordingly, there is a need for improved methods and systems that solve the problem of the data stream expanding when all of the input symbols have close to the same frequency in the symbol stream. Further, it is desirable to have a compression technique that allows devices connected by low bandwidth transmission channels to a server to receive files that have been efficiently compressed.

SUMMARY OF THE INVENTION

In accordance with the present invention, system and methods providing for associating a codeword with symbols from a file are presented. In an exemplary method for associating a codeword with symbol in a file, the frequency of occurrence of the symbols in the file is determined. Next, a threshold is determined. Explicit codewords are assigned to symbols with greater than the threshold. The remaining symbols are ordered in sequence and implicit codewords are assigned to all of the remaining symbols. Finally, a table associating the codeword for each symbol is generated.

It is to be understood that both the foregoing general description and the following detailed description are exemplary and explanatory only, and should not be considered restrictive of the scope of the invention, as described and claimed. Further, features and/or variations may be provided in addition to those set forth herein. For example, embodiments of the invention may be directed to various combinations and sub-combinations of the features described in the detailed description.

BRIEF DESCRIPTION OF THE DRAWINGS

The accompanying drawings provide a further understanding of embodiments of the invention and, together with the detailed description, explain certain features and exemplary embodiments of the invention. In the drawings.

DETAILED DESCRIPTION

Consistent with the invention, methods and systems are provided for efficient and compact encoding and decoding of a symbol stream. When a file of symbols, such as a screen of pixel data, needs to be encoded, the file may be divided into two sets of symbols, depending on the symbol's probability of occurrence in the symbol stream. During encoding a symbol may be assigned a code or codeword, which is the binary representation of the symbol. The first set of symbols have a high frequency of occurrence in the file and fall above a threshold. The second set of symbols have a lower probability of occurrence and fall below the threshold. A Huffman-type algorithm may be used to assign the codewords for the first set of symbols. This assignment may be referred to as explicit encoding, as specific codewords are assigned to symbols based on frequency of occurrence of the symbols in the file. The second set of symbols have a low frequency of occurrence in the file and may have codewords assigned based on the sequence of the symbols, e.g., a=1, b=2. This assignment may be referred to as implicit encoding, as the codeword for the symbols may be implied by the position of the symbol in a sequence in an encoding table. An encoding table may be generated during the encoding process and associates a codeword with each symbol. The encoding table is sent with the encoded file of symbols, so that the receiving end of the communication can correctly decode the encoded file.

Embodiments of the present invention may be implemented and used in connection with various compression methods. By way of a non-limiting example, an exemplary implementation will be described with reference to the Sun Ray™ system, including a thin-client device connected to a server. In at least one embodiment, the thin-client device displays a screen to the user, where the screen is generated by the server and transferred in compressed format to the thin-client device. As can be appreciated by those skilled in the art, embodiments of the invention can be implemented for other types of client-server systems, such as those used with PDA's, mobile phones, next-generation phones, settop boxes, other thin-client devices, and small computing devices. Further, use of the compression technique can be applied not just to low-bandwidth transfer of data, but also to any data types in need of compression, such as photographs, music, movies, or other large files.

Figure 1:
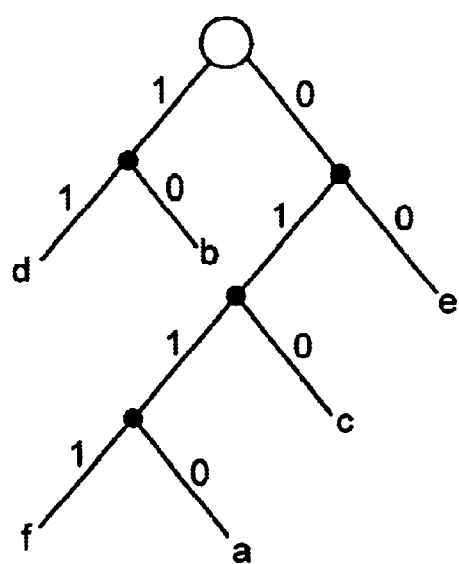
FIG. 1 illustrates an encoding tree generated by a Huffman encoding algorithm.
Figure 2:
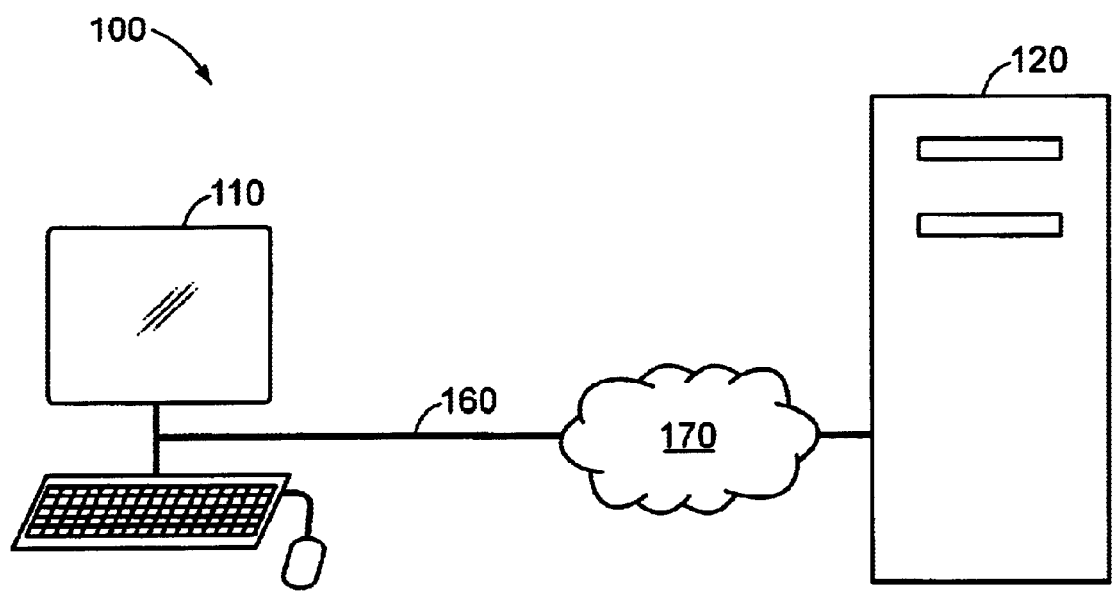
FIG. 2 illustrates an exemplary system for utilizing compression techniques consistent with the present invention.

FIG. 2 illustrates an exemplary system 100 for utilizing compression techniques consistent with the present invention. As shown in FIG. 2, system 100 includes a thin-client device 110 and a server 120. Both thin-client device 110 and server 120 may include a compression program (not shown), or a functional module of a compression program. Further, thin-client device 110 and server 120 may communicate over a connection 160, which may pass through network 170.

Thin-client device 110 may be a Sun Ray™ thin-client device for use in a networked environment. Server 120 may be a platform capable of connecting to thin-client device 110 and providing computing power for thin-client device 110.

In some embodiments, the compression program may include separate modules, for example an encoding module operating in server 120 and a decoding module operating in thin-client device 110. The encoding module may be executed to encode a file of symbols according to embodiments of the present invention. Once thin-client device 110 receives the encoded file of symbols, decoding module may be executed to decode the encoded file and regenerate the original file of symbols.

In some embodiments of the invention, other compression algorithms may be utilized along with compression programs according to the present invention. In transmission of pixel data (e.g., video data), for example, the compression program may compress pixel data at server 120 using a mathematical transform called the Discrete Wavelet Transform (DWT) before a compression program according to the present invention is executed. The output of the DWT is a sequence of coefficient symbols, which can then be encoded with a compression program according to the present invention and transferred to thin-client device 110 through connection 160.

Connection 160 couples thin-client device 110 and server 120. Connection 160 may be implemented as a wired or wireless connection using conventional communication protocols and/or data port interfaces. In general, connection 160 can be any communication channel that allows transmission of data between thin client 110 and server 120, including network channels and transfer of data between machines on fixed storage media. In some embodiments, for example, both thin-client device 110 and server 120 may be provided with conventional data ports, such as ADB, USB, SCSI, FIREWIRE, AAUI and/or BNC ports for transmission of data through the appropriate connection 160. In some embodiments, connection 160 may be a low-bandwidth connection.

Figure 3:
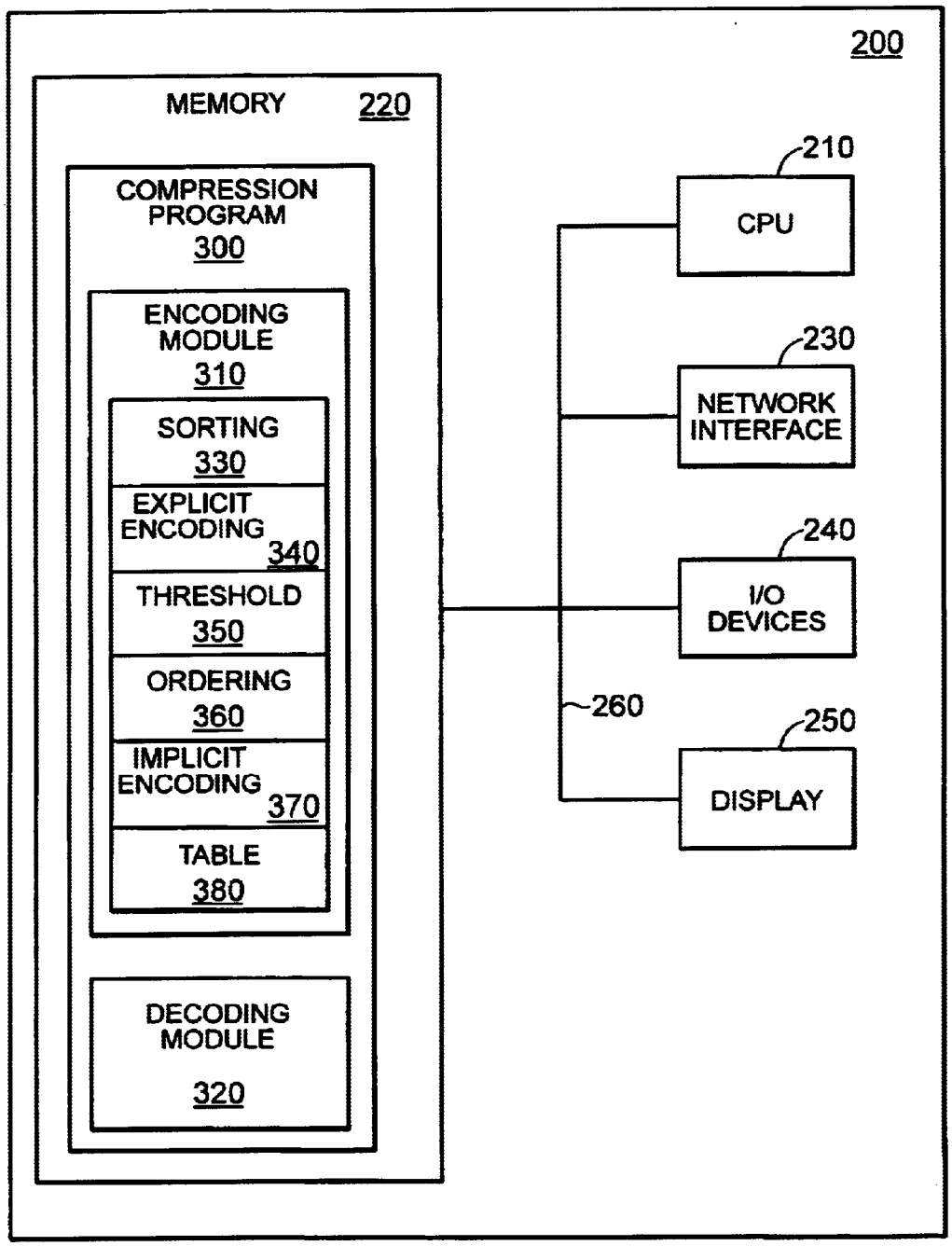
FIG. 3 shows a block diagram of an exemplary computing system, consistent with some embodiments of the invention.

FIG. 3 shows a block diagram of an exemplary computing system 200 with a compression system according to embodiments of the present invention. Computing system 200 can represent, for example, the internal components of an exemplary thin-client device 110 or server 120 capable of running modules of compression program 300.

Computing system 200 may include a number of components, such as a processor or central processing unit (CPU) 210, a memory 220, a network interface 230, I/O devices 240, and/or a display 250. Some or all of these components may be interconnected by a system bus 260, as shown in FIG. 3. CPU 210 may be a microprocessor such as the Pentium® family of microprocessors manufactured by Intel Corporation. However, any other suitable microprocessor, micro-, mini-, or mainframe computer may be used, such as a micro-controller unit (MCU), or a digital signal processor (DSP).

Memory 220 may include a random access memory (RAM), a read-only memory (ROM), a video memory, mass storage, and/or cache memory such as fixed and removable media (e.g., magnetic, optical, or magnetic optical storage systems or other available mass storage technology). Memory 220 stores modules of the compression program 300, including encoding module 310 and decoding module 320 as shown in FIG. 3. Encoding module 310 may further include sub-modules, such as sorting sub-module 330, explicit encoding sub-module 340, threshold sub-module 350, ordering sub-module 360, implicit encoding sub-module 370, and table generation sub-module 380.

Network interface 230, examples of which include Ethernet, dial-up telephone and/or other conventional data port connections, may be used to communicate with other devices through connection 160. As discussed above, connection 160 can include a communication network (not shown), direct connections, or any other channel for transferring data between devices.

Computing system 200 may also receive input via one or more input/output (I/O) devices 240, such as, for example, a keyboard, pointing device, or other like input devices. Computing system 200 may also present information and interfaces to a user by display 250, which may have any form capable of indicating information to a user.

Bus 260 may be a bi-directional system bus. For example, bus 260 may contain thirty-two address bit lines for addressing a memory 220 bit data lines across which data is transferred among the components. Alternatively, multiplexed data/address lines may be used instead of separate data and address lines.

In at least one embodiment, the modules of compression program 300 may be stored in a computer-readable medium, such as a disk or memory stick, and executed when the computer-readable medium and stored program instructions are read by server 120 or thin-client device 110. As illustrated in FIG. 3, compression program 300 may include encoding module 310 and decoding module 320. Encoding module 310 and decoding module 320 may be implemented as separate executable programs, or may be provided as components or routines of an integrated program. The program may be implemented with software or any combination of hardware, firmware and/or software to provide the necessary functionality and processes, consistent with embodiments of the invention.

Encoding module 310, operating on server 120 or client 110, receives and encodes a file of symbols. Various sub-modules of encoding module 310 manipulate the file of symbols to generate an encoded file and an encoding table. The encoded file and encoding table can then be transferred, for example, between server 120 and thin-client device 110. The receiving device then decodes the encoded file executing the algorithm in decoding module 320.

Sorting sub-module 330 determines the frequency of occurrence of symbols in the file. In at least one embodiment, sorting sub-module 330 may create a list of symbols ordered by frequency. In at least one embodiment, each symbol may be assigned a code length, also called a bit size, that approximates an optimal code length, such as $-\log_2(P) = \log_2(1/P)$, where P is the probability of the occurrence of a symbol. Since the code length is not an integer unless P is a negative power of two, fractional bits may be initially wasted, but the fractional bits can be recaptured and used to shorten the length of subsequent codes.

In some embodiments, the length of subsequent codewords may be shortened using the cumulative frequency counts of the symbols. After a symbol is encoded, a check may be done to determine if a symbol can be encoded, with a codeword using fewer bits, while at the same time not causing the subsequent encoding of symbols to use additional bits.

Explicit encoding sub-module 340 generates a set of codewords for the received symbols using a Huffman-type algorithm. In some embodiments, codewords are assigned to symbols based on determined code lengths. The code length may be modified by sorting sub-module 330 to decrease wasted code spaces. In at least one embodiment, each symbol may be assigned a specific codeword based on the frequency of occurrence of the symbol. Symbols which occur more frequently may be assigned codewords with a smaller numbers of bits.

In some embodiments, a check may be performed using a cumulative code probability (CCP). The CCP is the fraction of the total code space used by the codes up to and including the current code, defined as $CCP=(code+1)/(2^k)$, where k is the number of bits used by the current code. The cumulative probability (CumP) is the sum of the symbol counts used divided by the total of the counts. The condition that is enforced on these two values by the check is that at a given symbol, the number of bits used to encode a symbol is increased until CumP≧CCP.

Next, the explicit encoding sub-module 340 generates a set of codewords with the length specified by the sorting sub-module 330. To illustrate this process, using the set of symbols found in Table 1, a code table with the symbols sorted by frequency, as shown in Table 7, can be constructed.

TABLE 7

| Symbol | Count | CumP | CCP | Bits | Code |
|--------|-------|------|------|------|------|
| d | 5 | .333 | .250 | 2 | 00 |
| b | 4 | .600 | .500 | 2 | 01 |
| e | 3 | .800 | .750 | 2 | 10 |
| c | 1 | .866 | .812 | 4 | 1100 |
| a | 1 | .933 | .875 | 4 | 1101 |
| f | 1 | 1.000 | .937 | 4 | 1110 |

The algorithm that generates this table in sorting submodule 330 and explicit encoding 340 can be similar to the canonical Huffman encoding algorithm, where the computation of the number of bits used is actually included in the loop that generates the codes. An example of such an algorithm is given by the following segment:

```
s[k] = the kth symbol in the set sorted in order of decreasing frequency
huffsize[sym] = the number of bits needed for sym
huffcode[sym] = the codeword for symbol sym
counts[k] = the frequency count for symbol s[k]
total_count = the total symbol count
N be the total number of symbols
k = 0;
code = 0;
nbits = 0;
cum = 0;      /* Cumulative count */
while (k < N) {
    sym = s[k];
```

-continued

```
        cum = cum + counts[k];
        while (cum < ((code + 1) * total_count) >> nbits) {
            code = code << 1;
            nbits = nbits + 1;
        }
        huffsize[sym] = nbits;
        huffcode[sym] = code;
        code = code + 1;
        k = k + 1;
}
```

The codes shown in Table 7 are different from the optimal codes shown in Table 2, and additionally, code space is wasted in the coding shown in Table 7, such as, for example, the unused "1111" code. To solve the problem of wasted code space, the number of codes still needed in the encoding process can be tracked, along with how many codes are left utilizing the current number of bits. The number left at level nbits is simply left =(1<<nbits)−code and the number of codes needed is need =N−k.

Once a table like that shown in Table 7 is constructed, threshold sub-module module 350 uses one or more of a variety of factors to determine the criteria for switching between explicit encoding and implicit encoding. In some embodiments, the threshold may be a frequency value. In at least one embodiment, the threshold may be determined by a consideration of when the number of bits saved using an explicit codeword for a symbol becomes smaller then the expense of encoding the explicit codeword in a table. In some embodiments of the invention, the threshold may be determined by consideration of when there are enough codewords left at the current bit length to encode all of the remaining symbols implicitly. In some embodiments of the invention, threshold sub-module 350 sets a threshold by limiting the maximum number of bits used for an encoding. In situations with a very large numbers of symbols, very long codes may be generated. In some embodiments, a maximum code size may be limited to, for example, 16 bits.

In some embodiments, reaching a point where need≦left, implicit code generation can be started. As long as need< left, one less bit can be used to encode the current symbol.

In some embodiments, the trigger to switch to implicit codes is based on the amount of space saved utilizing an implicit code over that utilizing an explicit code. If not enough space is saved using an explicit code, implicit coding can be triggered. To compute the number of bits saved by using an explicit code, the total bits that would be used to represent the occurrences of the symbol as an explicit vs. implicit code are compared. In an explicit code, the symbol must appear as part of the encoding table that is sent with the encoded data, which takes $range_{13}$ bits=ceil($\log_2$(range)), where range=max_sym−min_sym+1 and the function ceil is the ceiling functions which rounds up to the nearest integer. In Table 7, there are 6 symbols, so range_bits=3. Thus, the total bits required for symbol k in the list is counts[k] * nbits+ range_bits. We can compute the maximum number of bits that it would take to represent each of the remaining symbols as an implicit code by finding maxbits such that need≦left <<(maxbits−nbits). Shifting the size of the codeword by one bit doubles the number of available codes, which is done until there are enough bits to express all of the remaining symbols. An implicit encoding of symbol k takes counts[k] * maxbits, so that the number of bits saved by doing an explicit encoding is counts[k] * (maxbits −nbits)−range_bits. Since the implicit encoding of a given symbol might be one bit smaller than maxbits, because of the leftover code space described above, the number of bits saved is required to be greater than $range_{13}$ bits. This guarantees that an explicit code will always be smaller than an implicit code.

The explicit encoding can then be modified with triggers to break out of the explicit loop at the threshold point, when either need≦left or not enough bits are saved by doing an explicit encoding. An example explicit loop in some embodiments of the invention can be implemented as follows:

```
k = 0;
code = 0;
nbits = 0;
cum = 0;       /* Cumulative count */
need = N;
left = 1;
maxbits = range_bits;    /* Must be at least this big */
while (k < N) {
    sym = s[k];
    cum = cum + counts[k];
    /*
    * Adjust maxbits so that it is big enough to do
    * the rest of the codes implicitly.
    */
    while (need > (left << (maxbits − numbits)))
        maxbits = maxbits + 1;
    while (1) {
        left = (1 << nbits) − code;
        /*
        * saved is how many bits saved if this is done as
        * an explicit code.
        */
        saved = counts[k] * (maxbits − nbits) − range_bits;
        /*
        * If we can fit the rest into this size, or if
        * not more than range_bits are saved, go do implicit
        * codes.
        */
        if (need <= left || saved <= range_bits) {
            /*
            * If not equal, then there's room to do
            * implicit codes with one less bit, so
            * back up one bit.
            */
            if (need < left) {
                nbits = nbits − 1;
                code = code >> 1;
            }
            goto implicit;
        }
        /* CumP >= CCP */
        if (cum >= ((code + 1) * total_count) >> nbits)
            break;
        code = code << 1;
        nbits = nbits + 1;
    }
    huffsize[sym] = nbits;
    huffcode[sym] = code;
    code = code + 1;
    k = k + 1;
    need = need − 1;
    left = left − 1;
}
```

In some embodiments of the invention, the maximum number of bits used for an encoding can be limited. With a very large symbol sequence, it is possible for long codes to be generated. Since these codes have small frequencies, collapsing them into shorter, non-optimal codes has little effect on the overall compression, but it can make implementation of the encoder and decoder simpler. The maximum code size may be limited, for example, to sixteen bits. A sixteen-bit code size is convenient for most computer architectures because the size of masks and other data is often implemented in sixteen bits.

Limiting the code length can be accomplished by comparing the maximum remaining number of codes that can be represented within the sixteen-bit limit to the number of symbols left to be encoded. The computation can be done before a code is assigned to determine if there would be enough codes left after the assignment to fit within the limit. The maximum codes left after assignment can be represented as maxleft=(left−1)<<(BITLIMIT−nbits);

where BITLIMIT is the desired maximum code length. This limitation, for example, can be implemented by replacing the line "left=(1<<nbits)−code;" in the upper while loop of the previous example code segment with the following loop:

```
while (1) {
    left = (1 << nbits) - code;
    maxleft = (left - 1) << (BITLIMIT - nbits);
    /* Have enough space? */
    if ((need - 1) <= maxleft)
        break;
    /* No, bump the number of bits */
    nbits = nbits + 1;
    code = code << 1;
}
```

The above example code segment causes the number of bits to increase rapidly enough that all of the codes fit in sixteen bits, even though the optimal representation would take more bits for some codes and fewer bits for others.

Once symbol values have been explicitly generated and a threshold met, ordering sub-module 360 (FIG. 3) orders the remaining symbols in sequence. In some embodiments, the remaining symbols are placed in ascending symbol order from a minimum bit value to a maximum bit value. In at least one embodiment, if a symbol in the sequence does not occur in the file, the missing symbol may still be included in the ordered sequence.

Sorting by value allows the decoding module 320 to generate implicitly the same codes at the receiving end of the transmission. If there are symbols within the range that do not occur, that is, their frequency counts are zero, they still must be included in the implicit codes. In some embodiments, such symbols can be treated as if their frequency counts were one.

Next, implicit encoding sub-module 370 generates the codewords for the remaining symbols. In some embodiments, implicit encoding may be generated, for example, with an algorithm such as the following:

```
/* Sort the s[k] for [k, N) by ascending symbol order */
sort(s, k, N);
while (k < N) {
    sym = s[k];
    while (1) {
        left = (1 << nbits) - code;
        if (need <= left || need < 2 * left)
            break;
        code = code << 1;
        nbits = nbits + 1;
    }
    huffsize[sym] = nbits;
    huffcode[sym] = code;
    code = code + 1;
    k = k + 1;
```

```
    need = need - 1;
}
```

Therefore, in the above example, an encoding from encoding module 310 can generate the list of codewords listed in Table 8 from the data shown in table 5.

TABLE 8

| Symbol | Code |
|--------|------|
| a      | 1100 |
| b      | 1101 |
| c      | 0    |
| d      | 10   |
| e      | 1110 |
| f      | 1111 |

As an example of encoding a symbol stream with many implicit codes, consider an example of nine symbols, 'a' to 'i', that each occur mincnt times. In some embodiments, only implicit encoding is utilized. Table 9 illustrates an example of encoding the nine symbols, illustrating the need and left parameters. In generation of table 9, only implicit encoding has been performed.

TABLE 9

| Symbol | Need | Left | 2*Left | Bits | Code |
|--------|------|------|--------|------|------|
| a      | 9    | 8    | 16     | 3    | 000  |
| b      | 8    | 7    | 14     | 3    | 001  |
| c      | 7    | 6    | 12     | 3    | 010  |
| d      | 6    | 5    | 10     | 3    | 011  |
| e      | 5    | 4    | 8      | 3    | 100  |
| f      | 4    | 3    | 6      | 3    | 101  |
| g      | 3    | 2    | 4      | 3    | 110  |
| h      | 2    | 2    | —      | 4    | 1110 |
| i      | 1    | 1    | —      | 4    | 1111 |

In the example illustrated in Table 9, encoding can become very compact because there are no explicit codes. Basic encoding would yield encoded symbols with a 4 bit code. The implicit encoding process saves almost an entire bit per symbol because all but two of the symbols are encoded with 3 bits. The same encoding will result if the counts for the symbols are equal but greater than mincnt. In this case, the number of bits required for the first symbol reaches 4 bits, at which point need≦left in the explicit loop. Since need (9)<left (16), the code drops back to 3 bits before entering the implicit loop.

In general, implicit encoding sub-module 370 generates codewords for the symbols in the sequence. The remaining symbols are assigned codewords using any algorithm which can assign codewords to symbols in a sequence. In at least one embodiment, as the symbols increase in order they are assigned to codewords that increase in order.

Once all of the codewords are assigned to the symbols, an encoding table may be generated that associates all of the codewords with the symbols. The encoding table is sent with the encoded file for use by decoding module 320 in decoding the encoded file. In at least one embodiment of the invention, the encoding table may be constructed in such a way that symbols whose counts are below a threshold, those symbols implicitly encoded, do not need a specific association in the table. Instead of a specific association for the implicit codewords, the range of symbols may be placed in the encoding table.

In the example shown in Table 8, for example, the symbols "a", "b", "e", and "f" are not sent explicitly, and the table is effectively truncated after the codes for "c" and "d". In this case, the table only takes 2×3=6 bits, and the total size is 32+6=38 bits, which is now smaller than the input. The additional information that is required to decode the symbols is the range of the symbols in the input. Given the range of symbols from "a" to "f", and explicit sizes for symbols "c" and "d" (1 and 2 bits, respectively), it is possible to assign codes for the explicit symbols (c and d), and fill in the rest of the table with the correct codes for the implicit symbols (a, b, e, and f) at both server 120 and thin-client device 110.

Figure 4:
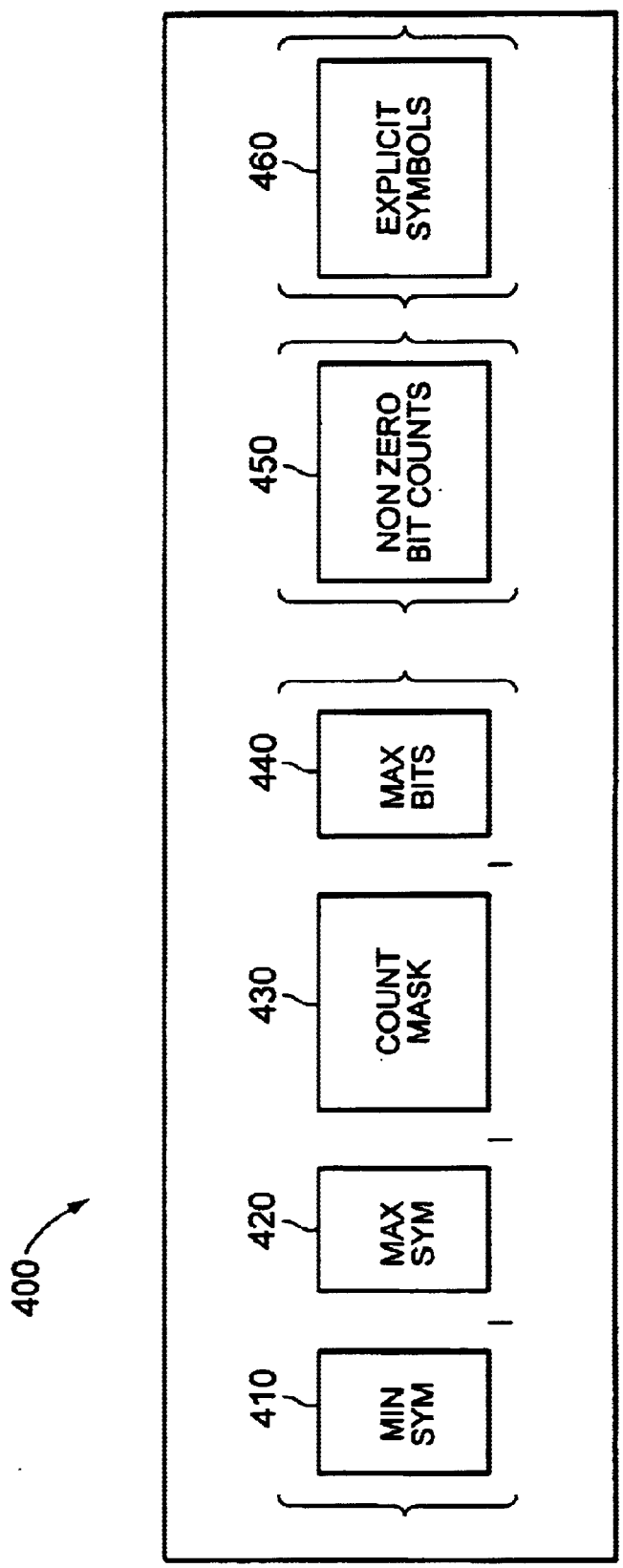
FIG. 4 is a block diagram that illustrates an encoding table, consistent with some embodiments of the invention.

FIG. 4 illustrates an embodiment of an encoding table 400 according to the present invention. In some embodiments, encoding table 400 may be encoded with the following values at the beginning of the table:

min_sym (410) value of the minimum symbol in the file max_sym (420) value of the maximum symbol in the file countmask (430) bit mask of non-zero bit counts bit i non-zero => count for i+1 bits is present maxbits (440) maximum number of bits for the implicit codes followed by the non-zero bit counts 450, followed by the explicit symbols 460.

Encoding table 400 for a set of symbols from "a" to "i" that are entirely implicitly encoded, as is shown in Table 9, would be:

{"a", "i", 0, 4}{ }{ }

In other embodiments, the order of the elements of the table may be varied. As another example, the codes in the example illustrated in Table 8 can have the following encoding table:

{"a", "f", 0011, 4 }{1, 1}{"c", "d"} for the three sections of the table. Note that the bit count for a size of 4 bits is zero, because all the codes for that size are implicit.

Once the file is encoded and encoding table 400 is generated, both elements (the encoding table and the encoded symbols) may be sent to thin-client device 110. There, decoding module 320 (FIG. 3) decodes the encoded file using encoding table 400. From encoding table 400, decoding module 320 has the maximum number of bits used in the encoding, together with the range of the symbols. Subtracting out the explicit symbols, decoding module 320 simply assigns the implicit codes in the same way that the implicit encoding sub-module 370 assign codewords.

Figure 5:
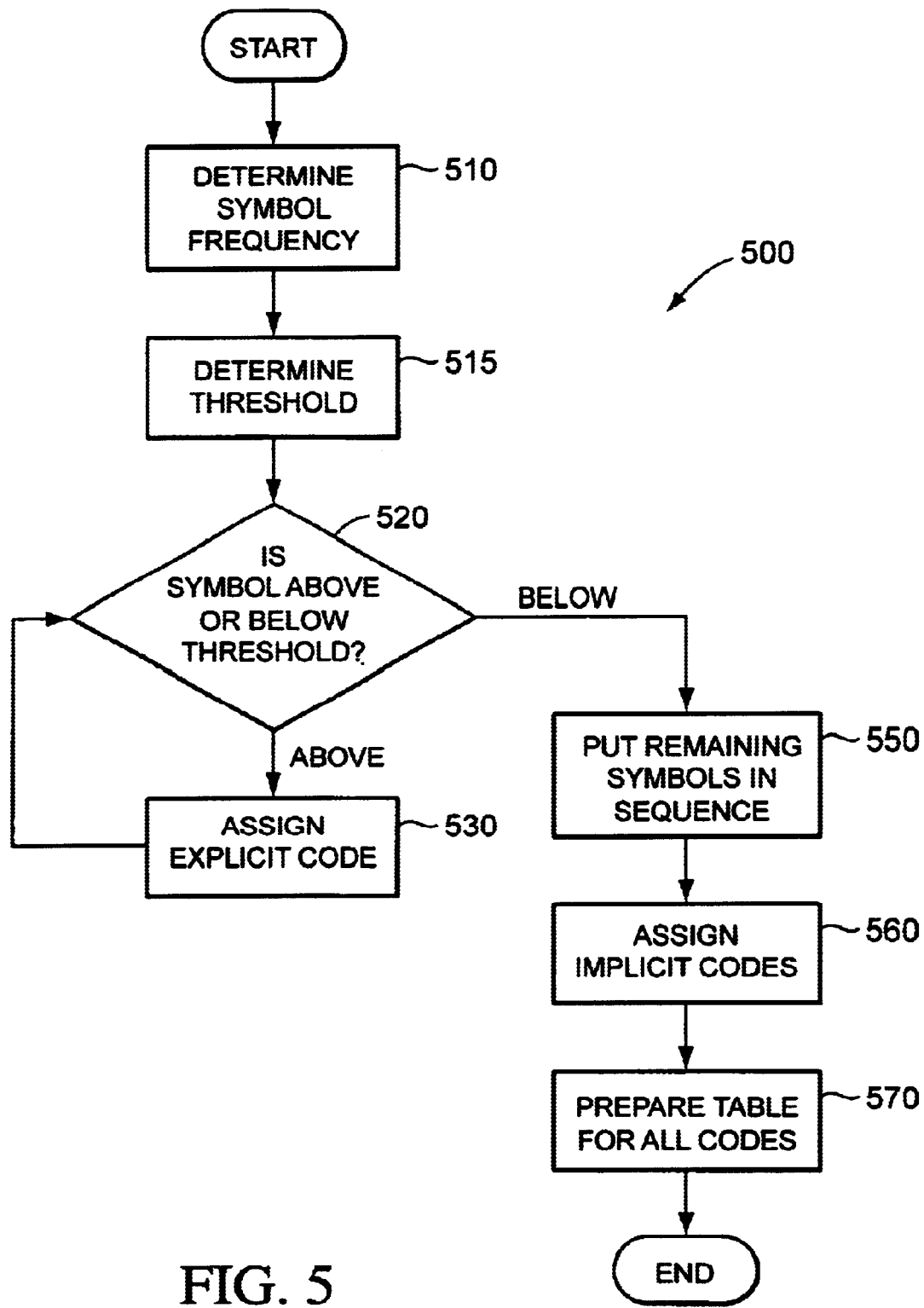
FIG. 5 shows a flowchart of an exemplary method for encoding, consistent with some embodiments of the invention.

FIG. 5 illustrates a flowchart of a method of encoding 500 a file of symbols according to some embodiments of the present invention. The frequency of occurrence of a symbol may be determined in step 510. In some embodiments, step 510 may be performed by frequency sorting sub-module 330 shown in FIG. 3. In some embodiments, the frequency of occurrence may be determined using estimated probabilities for a symbol or a specific analysis of the file. The frequency may determine the code length or bit size for the symbol.

In some embodiments, a check for bit space wasted by determined frequencies may be performed in step 510. In some embodiments, this check is performed using a cumulative code probability (CCP). The CCP is the fraction of the total code space used by the assignment of codewords up to and including the current codeword. As was discussed above, the CCP may be mathematically defined as CCP=(code+1)/($2^k$), where k is the number of bits used by the current codeword. The cumulative probability (CumP) is the sum of the symbol counts used divided by the total of the counts. In at least one embodiment, for a symbol, the number of bits used to assign a codeword may be increased until the cumulative probability is greater then or equal to the cumulative code probability.

In step 515, a threshold value for switching from explicit to implicit encoding can be determined. Methods of determining the threshold have been discussed above and include determining the threshold based on symbol frequency, determining the threshold based on a consideration of when the number of bits saved using an explicit encoding is greater than the number of bits saved using an implicit encoding, determining the threshold by consideration of when there are enough codewords left at the current bit length to encode all of the remaining symbols implicitly, and determining the threshold by limiting the maximum number of bits used for the encoding. In some embodiments, a threshold for switching may be the point when the number of codewords needed for encoding the remaining symbols is less than or equal to the number of codewords still available.

In another embodiment, the threshold may be the point when space is no longer being saved using explicit encoding. This point may be when the number of bits used with explicit encoding is greater than the number of bits needed with implicit encoding. The number of bits used in explicit encoding may be the number of bits of the explicit codeword multiplied by the number of times the codeword appears in the file, plus the number of bits needed to associate the codeword with the symbol in the encoding table. The number of bits used in implicit encoding may be the maximum number of bits necessary for encoding the symbol multiplied times the number of times the codeword appears in the file.

In yet another embodiment, the threshold point may be determined by the total possible code length limit. This limit may be accomplished by comparing the maximum remaining number of codes that can be represented within a set bit limit to the number of symbols left to be encoded. The comparison may be done before a codeword is assigned to determine if enough codes will be available after the assignment for the remaining symbols.

In step 520, the symbol may be reviewed to determine if a threshold is met. If the threshold has not been met (the NO branch from step 520), then an explicit code may be assigned in step 530. In some embodiments, the threshold may be determined by threshold sub-module 360 of FIG. 3.

In some embodiments, the assignment of an explicit code may be performed by explicit encoding sub-module 350 of FIG. 3. In at least one embodiment, an algorithm for assigning explicit codewords may be any algorithm which generates codewords based on frequency. In at least one embodiment, codewords are generated by canonical Huffman encoding.

The process of assigning explicit codewords may be repeated in the loop of steps 520 and 530 until the threshold determined in step 515 is met or all of the symbols have been explicitly encoded. Once the threshold has been met, the algorithm proceeds to step 550 where the remaining symbols are ordered in sequence. In some embodiments, ordering in sequence may be performed by ordering sub-module 360 of FIG. 3. In some embodiments, ordering in sequence may be ordering symbols from a low value to a high value. In step 560, implicit codes are assigned to the remaining symbols (step 560). In at least one embodiment, implicit encoding may be performed by implicit encoding sub-module 370 of FIG. 3, where codewords are assigned in sequence to the ordered set of symbols.

Thus, for the example shown in Table 5, Table 10 shows a list of codewords that may be generated for the file of symbols "a" through "f" with the indicated number of counts, or frequency in the file.

TABLE 10

| Count | Bit Size | Symbol | Code | Type of Encoding |
|---|---|---|---|---|
| 6 | 1 | c | 0 | explicit |
| 5 | 2 | d | 10 | explicit |
| 1 | 4 | a | 1100 | implicit |
| 1 | 4 | b | 1101 | implicit |
| 1 | 4 | e | 1110 | implicit |
| 1 | 4 | f | 1111 | implicit |

Once all of the symbols have a codeword, encoding table 400 may be prepared in step 570. The encoding table as illustrated, for example, by FIG. 4, for the symbols in Table 1 would be:

{"a", "f", 0011, 4}{1, 1}{"c", "d"}

Figure 6:
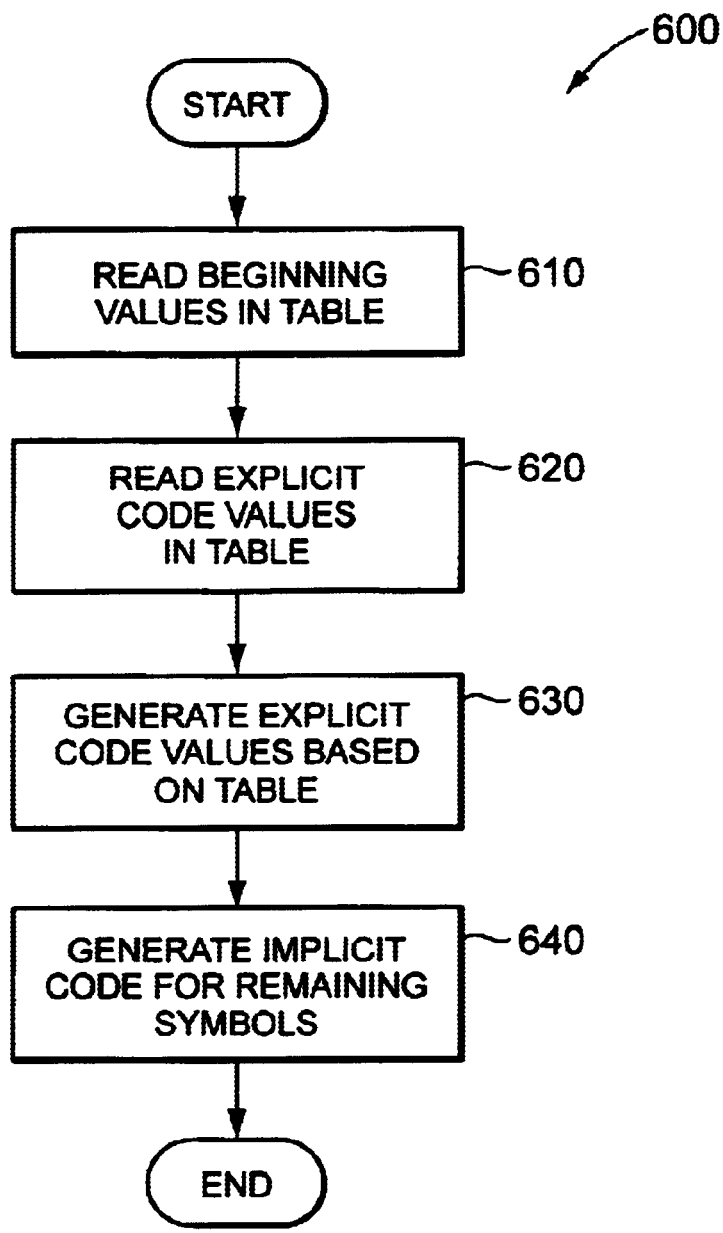
FIG. 6 shows a flowchart of an exemplary method for decoding, consistent with some embodiments of the invention.

FIG. 6 shows a flowchart illustrating an exemplary method 600 of decoding a file of symbols that have been encoded according to the present invention. Decoding module 320 executes an algorithm that creates the same set of code sizes and codewords for the symbols as was created by encoding module 310. In step 610, decoding module 320 reads the beginning values in encoding table 400. In some embodiments, decoding module 320 reads the minimum symbol, the maximum symbol, the countmask, and the maximum number of bits used from encoding table 400, as was illustrated in FIG. 4. Using the minimum symbol and the maximum symbol, a list of all of the symbols which were encoded with a codeword can be generated.

In step 620, decoding module 320 reads the explicit coding values from encoding table 400. In some embodiments, decoding module 320 reads the bit length counts for the explicit codes from encoding table 400. In step 630, decoding module 320 reads in the list of all symbols and assigns the size and code for each explicit symbol. Using the bit length counts for the explicit codes, and list of the symbols to be explicitly coded in encoding table 400, a codeword may be assigned to each explicitly encoded symbol. In order to indicate that a codeword was explicitly encoded, decoding module 320 may next initialize the explicit symbols in the list of all symbols to an invalid value.

Finally, in step 640, decoding module 320 generates the implicit codes (step 640). In some embodiments, decoding module 320 recovers wasted bit size. The result of these steps may be a set of codewords for each symbol identical to the codeword created by encoding module 310. The set of codewords may be used to decode the file sent with encoding table 400 between server 120 and thin-client 110.

Other embodiments of this invention may be generalized beyond binary representations to n-dimensional representation, using n-dimensional Huffman trees, where the basic encoding symbols are not limited to {0, 1}, but can be {0, 1, 2,. . . ,n−1}.

Although embodiments of the present invention are described as being associated with programs stored in memory and other storage mediums, one skilled in the art will appreciate that these aspects can also be stored on, or read from, other types of computer-readable media, such as secondary storage devices, like hard disks, floppy disks, or CD-ROM; a carrier wave from the Internet; or other forms of RAM or ROM. Accordingly, the invention is not limited to the above-described embodiments, but instead may be defined by the appended claims in light of their full scope of equivalents. Additionally, the examples provided with this disclosure are provided for the purposes of illustration only and are not intended to be limiting.

Further, methods consistent with embodiments of the invention may conveniently be implemented using program modules, hardware modules, or a combination of program and hardware modules. Such modules, when executed, may perform the steps and features disclosed herein, including those disclosed with reference to the exemplary flow charts FIGS. 5 and 6. The operations, stages, and procedures described above and illustrated in the accompanying drawings are sufficiently disclosed to permit one of ordinary skill in the art to practice the invention. Moreover, there are many computers and operating systems that may be used in practicing embodiments of the instant invention and, therefore, no detailed computer program could be provided that would be applicable to these many different systems. Each user of a particular computer will be aware of the language, hardware, and tools that which are most useful for that user's needs and purposes.

The above-noted features and aspects of the present invention may be implemented in various environments. Such environments and related applications may be specially constructed for performing the various processes and operations of the invention, or they may include a general-purpose computer or computing platform selectively activated or reconfigured by program code to provide the functionality. The processes disclosed herein are not inherently related to any particular computer or other apparatus, and aspects of these processes may be implemented by any suitable combination of hardware, software, and/or firmware. For example, various general-purpose machines may be used with programs written in accordance with teachings of the invention, or it may be more convenient to construct a specialized apparatus or system to perform the required methods and techniques.

Embodiments of the present invention also relate to computer-readable media that include program instructions or program code for performing various computer-implemented operations based on the methods and processes of embodiments of the invention. The program instructions may be those specially designed and constructed for the purposes of the invention, or they may be of the kind well known and available to those having skill in the computer software arts. Examples of program instructions include, for example, machine code, such as produced by a compiler, and files containing a high-level code that can be executed by the computer using an interpreter.

Other embodiments of the invention will be apparent to those skilled in the art from consideration of the specification and practice of the embodiments of the invention disclosed herein. It is intended that the specification and examples be considered as exemplary only, with a true scope and spirit of the invention being indicated by the following claims. As such, the invention is limited only by the following claims.

What is claimed is:

1. A method of associating a codeword with each symbol in a file, comprising:

determining a frequency of occurrence of each of the symbols in the file;

determining a threshold;

assigning an explicit codeword as the codeword of each symbol in the file where the frequency of occurrence for that symbol is greater than the threshold;

ordering the remaining symbols in sequence;

assigning an implicit codeword as the codeword of each of the ordered symbols; and generating an encoding table associating the codewords assigned to each of the symbols with the symbols.

2. The method of claim 1, wherein the file of symbols is generated using a Discrete Wavelet Transform of video data.

3. The method of claim 1, wherein the frequency of occurrence of a symbol in the file determines a code length of the codeword assigned to the symbol.

4. The method of claim 3, wherein the code length is determined by $-\log2(P)$, where P is the probability of the symbol occurring in the file.

5. The method of claim 3, wherein the code length is shortened when a cumulative code probability is greater than or equal to a cumulative probability, wherein the cumulative code probability is a fraction of a total code space up to and including a current code length and the cumulative probability is the sum of the code lengths used divided by a total of counts.

6. The method of claim 1, wherein the threshold is where a number of bits saved using the explicit codeword is less then a number of bits needed to describe the codeword with the implicit codeword in the encoding table.

7. The method of claim 1, wherein the threshold is determined by when there are enough codewords left using a current code length to encode all of the remaining symbols.

8. The method of claim 1, wherein the threshold is modified when a maximum number of bits used to encode any symbol would be greater then a prescribed maximum value.

9. The method of claim 1, wherein explicit encoding comprises:
   picking a symbol;
   determining a codeword length; and
   assigning an available bit value for the code length.

10. The method of claim 9, wherein if the number of codewords needed to encode all of the symbols is less then the number of possible codewords for a current number of bits, then the codeword length is decreased.

11. The method of claim 1, wherein ordering is performed by sorting the symbols into ascending symbol order.

12. The method of claim 1, wherein implicit encoding assigns remaining bit values of the codewords in ascending order.

13. The method of claim 1, wherein the ordered list includes symbols in sequence with a value of zero.

14. The method of claim 1, wherein the table includes a value of the maximum symbol, a value of the minimum symbol, a bit mask of a non-zero bit counts, a maximum number of bits for implicit codewords, a set of non-zero bit counts, and a set of explicit symbols.

15. A apparatus for associating a codeword with each symbol from a file, comprising:
   a sorting module to sort each of the symbols into a frequency list from most to least used symbols;
   a sorting module to determine a frequency of occurrence of a symbol;
   a threshold module to determine a threshold;
   an explicit encoding module to assign an explicit codeword as the codeword of each symbol where the frequency of occurrence of that symbol is greater than the threshold;
   an ordering module to order the remaining symbols in sequence;
   an implicit encoding module to assign an implicit the codeword as the codeword of each of the ordered symbols; and
   a table module to generate a table associating the codewords assigned to each of the the symbols with the symbols.

16. A computer-readable medium that stores instructions, which when executed perform steps in a method for associating a codeword with symbols from a file, the steps comprising:
   determining a frequency of occurrence of each of the symbol;
   determining a threshold;
   assigning an explicit codeword as the codeword of each symbol in the file where the frequency occurrence for that symbol is greater than the threshold;
   ordering the remaining symbols in sequence;
   assigning an implicit codeword as the codeword of each of the ordered symbols; and
   generating a table associating the codewords assigned to each of the symbols with the symbols.

17. A method for associating a symbol with a codeword, comprising;
   reading an encoding table, wherein the encoding table comprises a maximum symbol, a minimum symbol, a bit mask of non-zero bit counts, a maximum number of bits for implicit codewords, a set of non-zero bit counts, and a set of explicit symbols;
   setting a codewords for the set of explicit symbols using the set of non-zero bit counts;
   determining a set of remaining symbols by removing the explicit symbols from the set of symbols between the minimun symbol and the maximum symbol;
   applying the implicit codewords to the set of remaining symbols.

18. The method of claim 17, wherein generating the encoding table comprises:
   sorting a file of symbols into a frequency list from most to least used symbols;
   determining a threshold point on the frequency list;
   assigning a explicit codeword to all input symbols greater than the threshold point;
   sorting the remaining symbols into an ordered list; and
   assigning an implicit codeword to all input symbols on the ordered list.

19. A method for transferring a file of symbols from a server to a thin-client device, comprising:
   determining a frequency of occurrence of each symbol in the file;
   determining a threshold;
   assigning an explicit codeword as the codeword of each symbol where the frequency of occurrence for that symbol is greater than the threshold;
   ordering the remaining symbols in sequence;
   assigning an implicit codeword as the codeword of each of the ordered symbols;
   generating a table associating the codewords assigned to each of the symbols withe the symbols; and
   transferring an encoded file and encoding table to the thin-client device.

* * * * *

UNITED STATES PATENT AND TRADEMARK OFFICE
CERTIFICATE OF CORRECTION

PATENT NO.    : 6,919,826 B1
DATED         : July 19, 2005
INVENTOR(S)   : John K. Peacock It is certified that error appears in the above-identified patent and that said Letters Patent is hereby corrected as shown below:

<u>Title page,</u>
Item [57], ABSTRACT,
Line 3, "codeward" should read -- codeword --.
Line 7, "then" should read -- than --.

<u>Column 17,</u>
Lines 18, 25 and 33, "then" should read -- than --.
Line 46, "of a non-zero" should read -- of non-zero --.
Line 49, "A" should read -- An --.
Lines 63-64, "implicit the codeword" should read -- implicit codeword --.

<u>Column 18,</u>
Line 2, "the the" should read -- the --.
Line 29, "a" should read -- the --.
Line 33, "minimun" should read -- mimimum --.
Line 42, "a explicit" should read -- an explicit --.
Line 61, "withe" should read -- with --.

Signed and Sealed this

Thirteenth Day of September, 2005

JON W. DUDAS
*Director of the United States Patent and Trademark Office*